United States Patent [19]

An et al.

[11] Patent Number: 5,450,420

[45] Date of Patent: Sep. 12, 1995

[54] ERROR CORRECTION SYSTEM FOR CORRECTING ERRORS GENERATED IN DIGITAL SIGNALS

[75] Inventors: Hyeong-keon An, Kyungki-do; Ho-chang Jeong, Seoul, both of Rep. of Korea

[73] Assignee: Samsung Electronics Co., Ltd., Suwon, Rep. of Korea

[21] Appl. No.: 95,596

[22] Filed: Jul. 26, 1993

[30] Foreign Application Priority Data

Jul. 25, 1992 [KR] Rep. of Korea .................. 92-13349

[51] Int. Cl.[6] ........................................ G06F 11/10
[52] U.S. Cl. ............................... 371/37.1; 371/39.1
[58] Field of Search .................... 371/37.1, 37.4, 37.5, 371/38.1, 39.1, 40.1

[56] References Cited

U.S. PATENT DOCUMENTS

| | | | |
|---|---|---|---|
| 4,205,324 | 5/1980 | Patel | 371/50 |
| 4,607,367 | 8/1986 | Ive et al. | 371/37 |
| 4,675,869 | 6/1987 | Driessen | 371/37 |
| 4,802,173 | 1/1989 | Baggen | 371/40 |
| 4,881,232 | 11/1989 | Sako et al. | 371/374 |
| 5,135,601 | 5/1994 | Lee et al. | 371/39.1 |

Primary Examiner—Roy N. Envall, Jr.
Assistant Examiner—Thomas E. Brown
Attorney, Agent, or Firm—Charles R. Donohoe; Robert A. Westerlund, Jr.; Stephen R. Whitt

[57] ABSTRACT

An error correction system including a syndrome modifier for receiving a syndrome and operating the equation $$S_i = S_i + \frac{S_{i+1}}{\alpha^k}$$

where i is an integer greater than or equal to zero, for transforming the syndrome into a new syndrome; an n-1 error correction circuit for receiving the syndromes modified by the syndrome modifier for n-1 error correction, a counter for varying the K value if the n-1 error correction fails; a circuit for outputting an $\alpha^K$ value corresponding to the K output signal of the counter, to the syndrome modifier, an error value operation circuit for receiving the output signal of the n-1 error correction circuit to calculate a substantial error value according to the equation $$e_i = e'_i / (1 + \alpha^{i \cdot k})$$

where i is an integer greater than or equal to zero; and an adder for receiving and adding the output signal and the syndrome from the error value operation circuit, to perform a final error correction.

2 Claims, 4 Drawing Sheets

ERROR CORRECTION SYSTEM FOR CORRECTING ERRORS GENERATED IN DIGITAL SIGNALS

BACKGROUND OF THE INVENTION

1. Field of the Invention

The present invention relates to an error correction system, and more particularly to an n error correction system using an n-1 correction method and apparatus.

2. Description of the Related Art

Generally, an error correction apparatus is applied to a digital communication system or a digital storage system, and can correct errors generated in the data to be received or reproduced.

Methods, for example, are known for correcting errors in a block of data. Hardware for correcting n-1 errors is capable of correcting n errors by repeated execution. For instance, triple error correction is made possible using two kinds of error correction hardware by repetition.

FIG. 1 is a block diagram illustrating a contemporary dual error correction system. A first coefficient operating circuit 1 receives syndromes $S_0$, $S_1$, $S_2$ and $S_3$ and generates two error correction polynomials $\sigma_1$ $\sigma_2$. A second coefficient operating circuit 2 recieves the two error correction polynomials $\sigma_1$ $\sigma_2$ and generates a coefficient K. A third coefficient operating circuit 3 recieves the coefficient K and generates a coefficient vector $\chi_1$. An error location value operating circuit 4 recieves the coefficient $\chi_1$ and generates two error locations $X^1$ and $X^2$. An error value operation circuit 5 recieves the two error locations $X^1$ and $X^2$ and generates two error values $\gamma_1$ and $\gamma_2$. An adder 6 recieves the two error values $\gamma_1$ and $\gamma_2$ and syndrome $S_0$ and generates a signal $e_k$ that is the correeected sequence.

The two error correction polynomials $a\sigma_1$ and $\sigma_2$ are generated by calculating the following two equations:

$$\sigma_1 = \frac{S_0 S_3 + S_1 S_2}{S_1^2 + S_0 S_2}$$

and $$\sigma_2 = \frac{S_1 S_3 + S_2^2}{S_1^2 + S_0 S_2}$$

where $\sigma_1$ and $\sigma_2$ are error correction polynomials.

a second coefficient calculating circuit 2 for receiving the error correction polynomials $\sigma_1$ and $\sigma_2$ to calculate a coefficient K as $\sigma_2$ divided by $\sigma_1^2$;

an $X_1$ calculating circuit 3 for operating an $X_1$ value satisfying $X_0 = k_3 + k_5 + k_6$ $X_1 = k_0 + k_2 + k_4$ $X_2 = k_0 + k_3 + k_4$ $X_3 = k_1 + k_2 + k_3 + k_4$ $X_4 = k_0 + k_7$ $X_5 = k_1 + k_2 + k_3 + k_4 + k_6$ $X_6 = k_0 + k_1 + k_2 + k_4 + k_7$ $X_7 = k_0 + k_1 + k_2 + k_4$ using the coefficient K (here, each symbol "+" represents an XOR operation);

an error location value operation circuit 4 for calculating $X_1 = X1 \cdot \sigma_1$ $X_2 = (1 + X_1) \cdot \pi_1$ using the $X_1$ value, where $X_1$ and $X_2$ are error locations and; and · is a multiplying operation.

an error value operation circuit 5 for receiving the error locations $X_1$ and $X_2$ to calculate $$\gamma_1 = \frac{S_0 X_2 + S_1}{X_1 + X_2}$$

and $$\gamma_2 = \frac{S_0 X_1 + S_1}{X_1 + X_2}$$

where $\gamma_1$ and $\gamma_2$ are error values. (The above description is disclosed in U.S. Pat. No. 5,315,601 and is expressly incorporated by reference).

FIG. 2 illustrates a detailed structure of the third coefficient operation circuit of FIG. 1, showing thirteen XOR gates which satisfy the aforementioned equations.

It should be noted that the system of the present invention is applicable to various dual error correction systems, and not restricted to the above-described dual error correction system.

The n error correction algorithm using the n-1 error correction system will be described below.

For n error correction, the Reed-Solomon code requires n error values and 2n syndrome equations for seeking n error locations.

First, in order to obtain 2n-2 syndromes for n-1 error correction, 2n-1 syndromes are obtained for n error correction from the following equation:

$S_0 = e_1 + e_2 e_3 + \ldots + e_n$ $S_1 = e_1 x_1 + e_2 X_2 + e_3 x_3 + \ldots e_n x_n$ \qquad (1)

$S_2 = e_1 x_1^2 + e_2 x_2^2 + e_3 x_3^2 + \ldots + e_n x_n^2$

...

$S_{2n-2} = e_1 x_1^{2n-2} + e_2 x_2^{2n-2} + e_3 x_3^{2n-2} + \ldots + e_n x_n^{2n-2}$ In the above equations, $e_i$ represents the error value and $x_i$ represent the error location.

To eliminate $e_n$ and $x_n$ from equation 1, in the Galois Field $GF(2^8)$, which is a field of 256 eight bit binary bytes, if $x_1 = \alpha^{B1}$, $X_2 = \alpha^{B2}$, $X_3 = \alpha^{B3}$, $X_4 = \alpha^{B4}$, and supposing $S_K'$, $= S_{K+1}/\alpha^{n+1}$ (where K=0, 1 ..., 2n-1; B is a primitive element of $GF(2^8)$; $\alpha$ is an element of the field $GF(2^8)$), the equations $S_0$, $S_1 \ldots$, $S_{2n-2}$ are transformed as follows:

$$S_0' = e_1\left(1 + \frac{\alpha^{\beta 1}}{\alpha^{\beta n} + 1}\right) +$$

$$e_2\left(1 + \frac{\alpha^{\beta 2}}{\alpha^{\beta n}+1}\right) + \ldots + e_{n-1}\left(1 + \frac{\alpha^{\beta n-1}}{\alpha^{\beta n}+1}\right)$$

$$S_1' = e_1\alpha^{\beta 1}\left(1 + \frac{\alpha^{\beta 1}}{\alpha^{\beta n} + 1}\right) +$$

$$e_2\alpha^{\beta 2}\left(1 + \frac{\alpha^{\beta 2}}{\alpha^{\beta n}+1}\right) + \ldots + e_{n-1}\alpha^{\beta n}\left(1 + \frac{\alpha^{\beta n-1}}{\alpha^{\beta n}+1}\right)$$

$$\ldots$$

$$S'_{2n-3} = e_1\alpha^{(2n-3)\beta 1}\left(1 + \frac{\alpha^{\beta 1}}{\alpha^{\beta n}+1}\right) +$$

$$e_2\alpha^{(2n-3)\beta 2}\left(1 + \frac{\alpha^{\beta 2}}{\alpha^{\beta n}+1}\right) + \ldots + e_{n-1}\alpha^{(2n-3)\beta n}\left(1 + \frac{\alpha^{\beta n-1}}{\alpha^{\beta n}+1}\right)$$

Here, $\alpha^{\beta N+1}$ is an assumed error location and indicates $\alpha_k$ of FIG. 3.

If we define $$e_i' = e_i\left(1 + \frac{\alpha^{\beta 1}}{\alpha^{\beta n+1}}\right)$$

where i is an integer greater than zero, the equations are transformed as $$S'_1 = e'_1 + e'_2 + e'_3 + \ldots + e'_{n-1}$$

$$S'_1 = e'_1 x_1 + e'_2 x_2 + e'_3 x_3 + \ldots + e'_{n-1} x_{n-1}$$

$$\ldots$$

$$S'_{2n-3} = e'_1 x_1^{2n-3} + e'_2 x_n^{2n-3} + \ldots + e'_{n-1} x_n^{2n-3}$$

From the syndrome transform algorithm, we get $$S_0' = e_1'' e_2'$$

$$S_1' = e_1'\alpha^{\beta 1} + e_2'\alpha^{\beta 2}$$

$$S_2' = e_1'\alpha^{2\beta 1} + e_2'\alpha^{2\beta 2}$$

$$S_3' = e_1'\alpha^{3\beta 1}\alpha e_2'\alpha^{3\beta 2}$$

when supposing $S_i' = S_i + S_{i+1}/\alpha^{\beta 3}$ and $e_i' = e_i(1 + \alpha^{\beta i}/\alpha^{\beta 3})$ where i is an integer greater than zero. Here, the dual error correction is repeated until successful, so as to obtain two error locations and two error values. Finally, a third error value and error location area obtained using $S_0$ and $S_1$.

An example of the triple error correction using the dual error correction algorithm uses a Reed Solomon Code. If an exact code word $C(s)=0$ and a received code word $r(x) = \alpha x + \alpha x^5 + \alpha x^6$, which consists of parity check digits and information digits, then $$S_0 = \alpha + \alpha^3 + \alpha^4 = \alpha^{105}$$

$$S_1 = \alpha \cdot \alpha + \alpha^3 \cdot \alpha^5 + \alpha^4 \cdot \alpha^6 = \alpha^{133}$$

$$S_2 = \alpha \cdot \alpha^2 + \alpha^3 \cdot \alpha^{10} \alpha^4 \cdot \alpha^{12} = \alpha^{216}$$

$$S_3 = \alpha \cdot \alpha^3 + \alpha^3 \cdot \alpha^{15} + \alpha^4 \cdot \alpha^{18} = \alpha^{170}$$

$$S_4 = \alpha \cdot \alpha^4 + \alpha^3 \cdot \alpha^{20} + \alpha^4 \cdot \alpha^{24} = \alpha^{174}$$

Here, let's suppose $\alpha = \alpha^6$. (If $\alpha \neq \alpha^6$, the dual error correction is carried out.) Then, $$S_0' = S_0 + S_1/\alpha^6 = \alpha^{85}$$

$$S_1' = S_1 + S_2/\alpha^6 = \alpha^{106}$$

$$S_2' = S_2 + S_3/\alpha^6 = \alpha^{50}$$

$$S_3' = S_3 + S_4/\alpha^6 = \alpha^{218}$$

If the dual error correction is performed using $S_0'$, $S_1'$, $S_2$ and $S_3'$, then $e_0' = \alpha^{134}$, $X_1 = \alpha$ and $e_1' = \alpha^{27}$, $x_2 = \alpha^5$ are obtained, and thus, real error values $e_0 = e_0'/(1+\alpha/\alpha^6) = \alpha$ and $e_1 = e_1'/(1+\alpha^5/\alpha^6) = \alpha^3$ are obtained, Then, the final error value is $e_2 = S_0 + e_0 + e_1 = \alpha^{105} + \alpha + \alpha^3 = \alpha^4$ and the final error location is $$X_3 = \frac{S_1 + e_0 x_1 + e_1 x_2}{e_2} = \frac{\alpha^{133} + \alpha^2 + \alpha^8}{\alpha^4} = \alpha^6$$

Here, the assumed value $\alpha = \alpha^6$ is obvious.

As described above, the three error value $\alpha$, $\alpha^3$ and $\alpha^4$ and error locations $\alpha$, $\alpha^5$ and $\alpha^6$ can be precisely obtained. The above shows a method of which triple error correction is performed using the conventional dual error correction method.

SUMMARY OF THE INVENTION

Therefore, it is an object of the present invention to provide an n error correction system using an n-1 error correction system.

It is another object of the present invention to provide an n error correction system using an n-1 error correction system without specially designing the hardware.

To accomplish the objects, there is provided an error correction system comprising:

a syndrome modifier for receiving a syndrome $S_{i+1}$ and operating the equation $$S_i' = S_i + \frac{S_{i+1}}{\alpha^k}$$

for transforming the syndrome $S_{i+1}$ into a new syndrome $S_i'$, where i is an integer greater than or equal to zero;

an n-1 error correction circuit for receiving the syndromes modified by the syndrome modifier for n-1 error correction;

a counter for varying the k value if the n-1 error correction fails;

means for outputting $\alpha^k$ corresponding to the kth output signal of the counter to the syndrome modifier;

an error value operation circuit for receiving the output signal of the n-1 error correction circuit to calculate a substantial error value according to the equation $$e_i = \frac{e_i'}{1 + \alpha^{i-k}}$$

where i is an integer greater than or equal to zero; and an adder for receiving and adding the output signal and the syndrome from the error value operation circuit to perform a final error correction.

DETAILED DESCRIPTION OF THE PRESENTLY PREFERRED EXEMPLARY EMBODIMENTS

Figure 3:
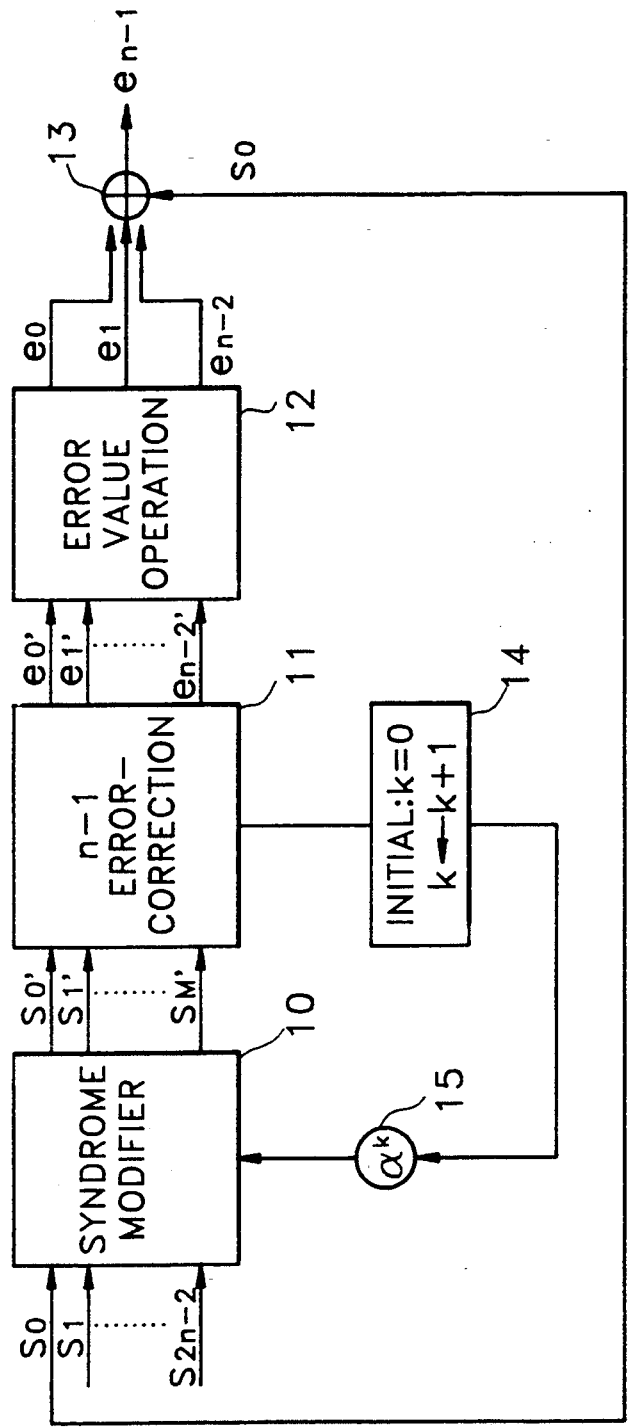
FIG. 3 illustrates a triple error correction system of the present invention.

FIG. 3 illustrates an n error correction system using the n-1 error correction system of the present invention.

Referring to FIG. 3, there is provided an n error correction system comprising a syndrome modifier 10 for receiving 2n-1 syndromes $S_0, S_1 \ldots, S_{2n-2}$ calculated by n error values and locations so as to modify the syndromes into $2_{n-2}$ new syndromes $S_0', S_1', \ldots, S_{2n+3}'$; an n-1 error correction circuit 11 for receiving the outputs $S_0', S_1' \ldots, S_{2n-3}'$ of syndrome modifier 10 so as to perform n-1 error correction; an error value operation circuit 12 for receiving n-1 outputs $e_0', e_1' \ldots, e_{n-2}'$ of error correction circuit 11 so as to calculate a substantial error value; an adder 13 for receiving and adding the outputs $e_0, e_1 \ldots, e_{n-2}$ of error value operation circuit 12 and syndrome $S_0$ so as to output a final error value $e_{n-1}$; a counter 14 for counting a repeating number when errors take place in n-1 error correction circuit 11, and an $\alpha^k$ value generator 15 for outputting an $\alpha^k$ value corresponding to the output signal counter 14 to syndrome modifier 10. The operation is performed according to the algorithm of the present invention.

Figure 4:
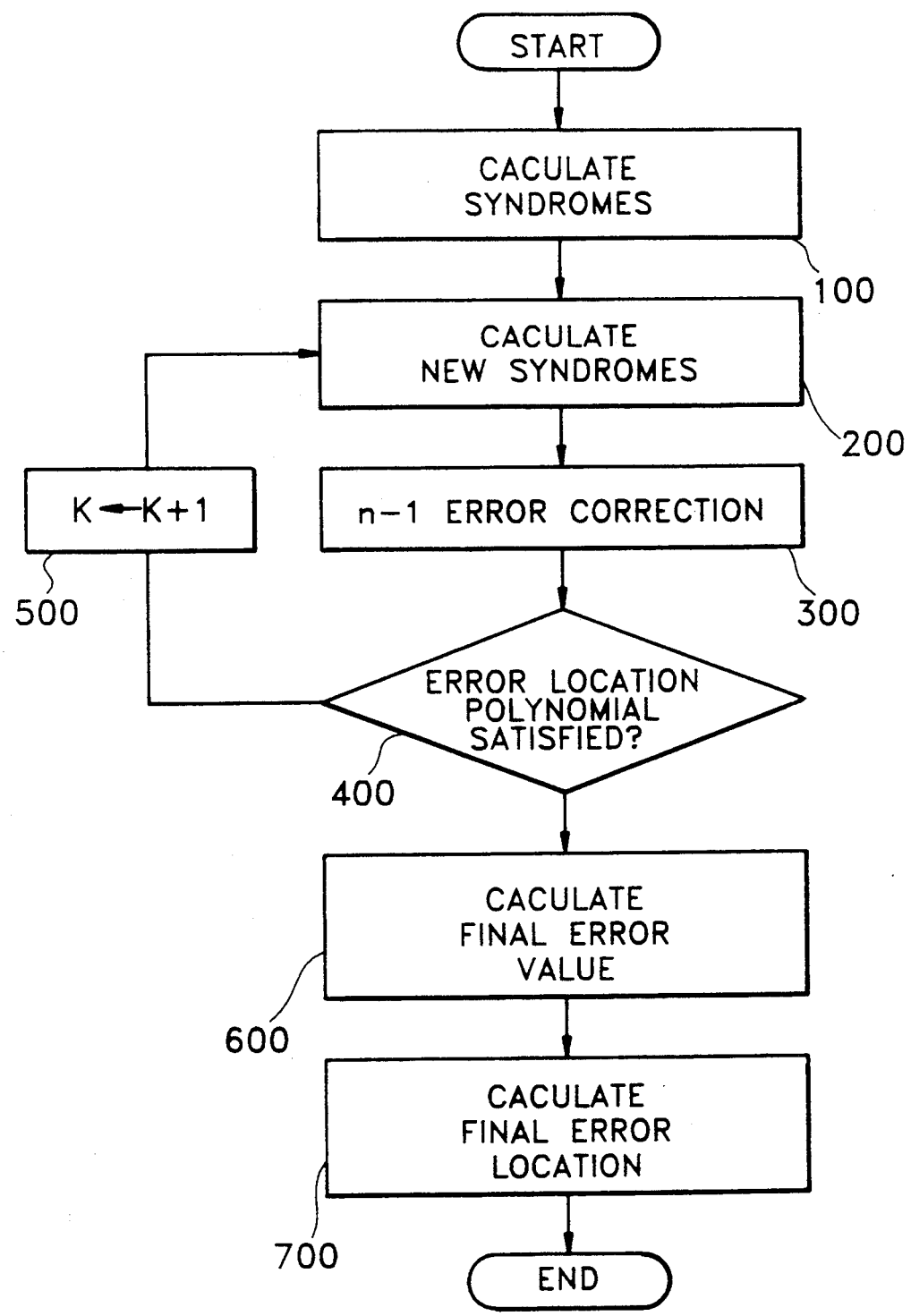
FIG. 4 is an operational flowchart of the system shown in FIG. 3.

FIG. 4 is an operational flowchart of the n error correction system according to the present invention.

Figure 1:
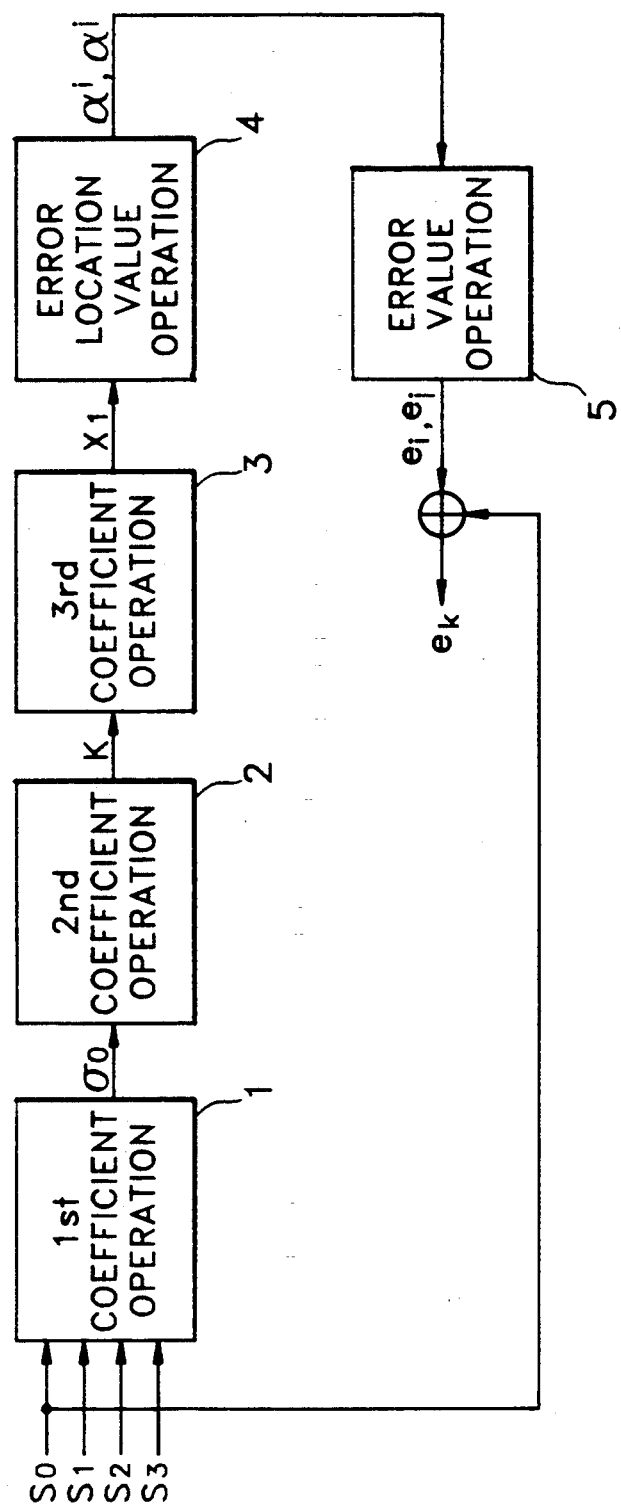
FIG. 1 is a block diagram of a conventional dual error correction system.
Figure 2:
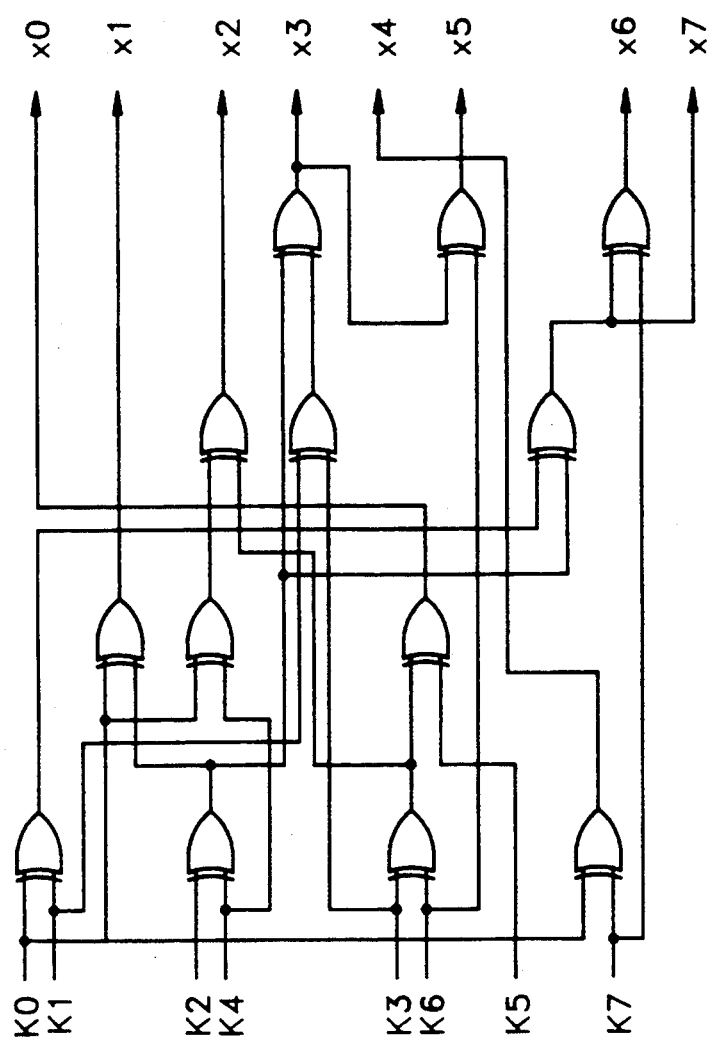
FIG. 2 is a logic circuit showing the detailed configuration of a coefficient operation circuit in FIG. 1.

Referring to FIG. 4, 2n-1 syndromes are calculated using the syndrome generator (step 100). The 2n-1 syndromes are transfored into 2n-2 new syndromes according to $$S_i = S_i + \frac{S_{i+1}}{\alpha^k}$$

where i is an integer greater than or equal to zero (step 200). Here, $\alpha^k$ is the initially assumed error location.

Next, n-1 error correction is performed using the 2n-2 new syndromes (step 300). It is determined whether the calculated error location and the initially assumed error locatioon satisfy the error location polynomial (step 400), and if not, steps 300 and 400 are repeated by incrementing coefficient k by ones until n-1 error correction succeeds (step 500). If accomplished, the next steps are carried out.

A final error value is calculated according to $e_i = e_i'(-1 + \alpha^{i+k})$, where i is a integer greater than or equal to zero, using the n-1 error values (step 600). Then, a final error location is calculated using the error value (step 700), to complete error correction.

That is, 2n-modified syndromes $S_0', S_1' \ldots, S_{2n-1}'$ are the 2n inputs to an n error correction Reed-Solomon decoder, to make it the desired n error correction system. Then, n error locations $X_1, X_2 \ldots, X_n$ are taken. Here, while $\alpha^n = X_{n+1}$ is varied from $\alpha^n$ to $\alpha^{255}$, in the first repetition, $\alpha^n$ is assumed. If the assumption is wrong, an n error correction decoder will not operate. In this case, $\alpha^{n+1}$ is substituted for $\alpha^n$ and n error locations and error values are repeatedly obtained. This is continued until the normal operation of the n error correction decoder resumes. Accordingly, 255-n+1 repetitions may be required at the utmost. However, usually, shortened codes are used to greatly reduce the substantially required number of repetition. In an error correction system for a digital compact cassette, since the Reed Solomon error correction code for an auxiliary track is RS(24,18,7), twenty-two repetitions (24-3+1) are required to the utmost. However, if this repetition is performed in parallel, the overall performance time does not increase and a triple error correction decoder is unnecessary, so that the amount of hardware does not increase much.

In conclusion, an n error correction system can be realized by repeatedly using an n-1 error correction system. When the triple error correction system uses the dual error correction system according the principle, performance time and hardware do not increase, so that the error correction is performed with ease.

What is claimed is:

1. An error correction system comprising:

a syndrome modifier for receiving a syndrome $S_{i+1}$ and operating the equation $$S_i' = S_i + \frac{S_{i+1}}{\alpha^k}$$

where i is an integer greater than or equal to zero, for transforming said syndrome $S_{i+1}$ into a new syndrome $S_i'$, and $\alpha^k$ is an error location;

an n-1 error correction circuit for receiving said syndromes modified by said syndrome modifier for n-1 error correction;

a counter for varying a K value if the n-1 error correction fails;

means for outputting an $\alpha^k$ corresponding to the K output signal of said counter, to said syndrome modifier;

an error value operation circuit for receiving the output signal of said n-1 error correction circuit to calculate a substantial error value according to the equation $$e_i e'_i / (1 + \alpha^{i-k})$$

where i is an integer greater than or equal to zero, $e_i$ is an error value, and $e_i'$ is a new error value; and an adder for receiving and adding the output signal and the syndrome from said error value operation circuit to perform a final error correction.

2. An error correction method of an error correction system for correcting errors generated in input digital signals comprising the steps of:

obtaining n error values and n error locations of said input digital signals;

obtaining syndromes using said error values and error locations;

modifying said syndromes into new syndromes according to $$S_i' = S_i + \frac{S_{i+1}}{\alpha^k}$$

where i is an integer greater than or equal to zero, for transforming said syndrome $S_{i+1}$ into a new syndrome $S_i'$, and $\alpha^k$ is an error location;

performing n-1 error correction using said new syndromes;

changing a K value and transmitting a $\alpha^k$ value corresponding to said K value to said modifying said syndromes step, to repeatedly perform the above steps until n-1 error correction succeeds if the error correction is not carried out in said error correction step, and a next step is performed if the error correction is accomplished;

calculating a substantial error value according to the equation $$e_i = e'_i/(1+\alpha^{i-k})$$

where i is an integer greater than or equal to zero, $e_i$ is an error value, and $e_i'$ is a new error value; and calculating a final error location using a final error value.

* * * * *